United States Patent [19]

Naruse et al.

[11] Patent Number: 5,618,590
[45] Date of Patent: Apr. 8, 1997

[54] PROCESS FOR MANUFACTURING A PISTON RING

[75] Inventors: Yoshio Naruse; Satomichi Miyazaki, both of Tokyo, Japan

[73] Assignee: Teikoku Piston Ring Co., Ltd., Tokyo, Japan

[21] Appl. No.: 464,306

[22] Filed: Jun. 5, 1995

Related U.S. Application Data

[62] Division of Ser. No. 943,289, Sep. 10, 1992, abandoned.

[30] Foreign Application Priority Data

Sep. 20, 1991 [JP] Japan ................................. 3-268791

[51] Int. Cl.⁶ ................................................. B05D 3/06
[52] U.S. Cl. ........................ 427/528; 427/530; 427/580; 204/192.16
[58] Field of Search ................................ 427/528, 530, 427/531, 580; 204/192, 12, 192.15, 192.16

[56] References Cited

U.S. PATENT DOCUMENTS

| | | | |
|---|---|---|---|
| 3,556,747 | 1/1971 | Hyde et al. | 29/198 |
| 3,615,099 | 10/1971 | Prasse | 277/235 A |
| 3,749,559 | 7/1973 | Prasse | 29/191.2 |
| 3,837,817 | 9/1974 | Nakamura | 29/195 |
| 3,915,757 | 10/1975 | Engel | 148/6 |
| 3,988,955 | 11/1976 | Engel et al. | 83/661 |
| 4,233,072 | 11/1980 | Watanabe et al. | 75/236 |
| 4,307,890 | 12/1981 | Cromwell et al. | 277/224 |
| 4,311,525 | 1/1982 | Nakamura | 75/240 |
| 4,323,257 | 4/1982 | Kando et al. | 227/224 |
| 4,486,285 | 12/1984 | Aubert et al. | 204/192 C |
| 4,557,492 | 12/1985 | Tsuchiya et al. | |
| 4,579,355 | 1/1986 | Kooroki | 277/216 |
| 4,707,238 | 11/1987 | Okubo | 204/192.31 |
| 4,756,841 | 7/1988 | Buran et al. | 252/26 |
| 4,883,574 | 11/1989 | dos Santos Pereina Ribeiro | 204/192.15 |
| 4,931,152 | 6/1990 | Naik et al. | 204/38.5 |
| 5,213,848 | 5/1993 | Zurecki et al. | 427/449 |

FOREIGN PATENT DOCUMENTS

| | | |
|---|---|---|
| 0326658A1 | 8/1989 | European Pat. Off. |
| 3802920 | 5/1989 | Germany. |
| 57-57868 | 4/1982 | Japan. |

(List continued on next page.)

OTHER PUBLICATIONS

Abstract of Kino Zairyo (1994), 14(8), 20–5; Nakayama.
Abstract of Jinshu Xuebao (1994), 30(5), B229–B232; Yu et al.
Abstract of Sci. Tech. Aerosp. Rep. 1990, 28(3), Abstr. No. N90–11882; Beaty et al.
Abstract of Tachan Kumsok Hakoechi (1995), 33(3), 332–9; Ye et al.

*Primary Examiner*—Shrive Beck
*Assistant Examiner*—Erma Cameron
*Attorney, Agent, or Firm*—Frishauf, Holtz, Goodman, Langer & Chick, P.C.

[57] ABSTRACT

Using an arc ion plating apparatus, a metal not capable of forming a carbide or nitride, such as cobalt, nickel or molybdenum is set as a first target, a metal capable of forming a carbide or nitride, such as silicon, titanium, vanadium, chromium, iron, zirconium, niobium or tungsten is set as a second target and nitrogen, acetylene or methane is fed as a process gas to form a film on a piston ring body which is an article to be coated, thereby providing a piston ring comprising a hard film formed on at least its sliding outer face of the piston ring body, said hard film comprising a mixed structure formed of the metal not capable of forming a carbide or nitride and a carbide or nitride of the metal capable of forming a carbide or nitride. In this piston ring, the hard film has so good adhesion to the body material or film toughness that no cracking or film separation tend to occur even when the film is formed in a large thickness. The carbide or nitride in the hard film contributes the achievement of a superior wear resistance. Because of the fine structure of the hard film, the wear of the opposing material can be decreased, no film lubrication tends to be lost and the seizure resistance can be improved.

8 Claims, 3 Drawing Sheets

FOREIGN PATENT DOCUMENTS

| | | |
|---|---|---|
| 57-65837 | 4/1982 | Japan. |
| 58-135648 | of 1983 | Japan. |
| 1-22922 | 7/1989 | Japan. |
| 1-33658 | 7/1989 | Japan. |
| 1069875 | 5/1967 | United Kingdom. |
| 1214197 | 12/1970 | United Kingdom. |
| 1441961 | 7/1976 | United Kingdom. |
| 2000812 | 1/1979 | United Kingdom. |
| 2190925 | 12/1987 | United Kingdom. |

5,618,590

PROCESS FOR MANUFACTURING A PISTON RING

This is a division of application Ser. No. 07/943,289 filed Sep. 10, 1992, now abandoned.

BACKGROUND OF THE INVENTION

1. Field of the Invention

This invention relates to an internal combustion engine piston ring having a hard film formed by ion plating on at least its sliding outer face, and a process for manufacturing the same.

2. Description of the Prior Art

In recent years, internal combustion engines for automobiles are increasingly made higher in their speed and power, resulting in an increase in thermal load around pistons. Hence, piston rings used therein are now sought to have a higher wear resistance and a higher seizure resistance.

The sliding outer faces of piston rings have been heretofore commonly treated by hard chromium plating, alloy thermal spraying or stainless steel nitriding, which have been put into use making the most of their features. Such conventional surface treatments, however, have become unsatisfactory in view of performance in some of the internal combustion engines having been made higher in speed and power.

For this reason, it is proposed in recent years to apply a PVD (physical vapor deposition) coating of a ceramic material having superior wear resistance and seizure resistance, to the sliding outer faces of piston rings, as disclosed, for example, in Japanese Laid-open Patent Applications No. 57-57868 and No. 57-65837, Japanese Laid-open Utility Model Application No. 58-35648, Japanese Utility Model Publication No. 1-22922 and Japanese Patent Publication No. 1-33658.

The ceramic material coatings or films formed by PVD, however, have had the problem that they are so hard and brittle that an attempt to make their thickness large enough to fulfill the lifetime of engines tends to cause chipping or peeling of films during use and a deterioration of the strength of the piston rings themselves.

Moreover, as to sliding performance, although very good wear resistance and seizure resistance can be achieved in usual sliding conditions, they may wear the opposing cylinder walls when used in combination with soft cast-iron cylinders and lubricating oil is in an extremely small quantity.

SUMMARY OF THE INVENTION

The present invention was made in order to solve the problems involved in the prior art discussed above. An object thereof is to provide a piston ring having a hard coating or film that can maintain wear resistance and seizure resistance, has both adhesion to its body material and film toughness and can be formed in a large thickness, and a process for manufacturing such a piston ring.

To achieve the above object, the piston ring of the present invention comprises a hard film formed by ion plating on at least its sliding outer face, wherein said hard film comprises a fine mixed structure formed of (a) a mixture of a carbide and a metal not capable of forming a carbide or (b) a mixture of a nitride and a metal not capable of forming a nitride.

The process for manufacturing a piston ring according to the present invention comprises;

causing an arc discharge in a process gas atmosphere comprised of nitrogen or carbon as a component element, using as a cathode a target comprised of a metal not capable of forming a carbide or nitride and a metal capable of forming a carbide or nitride, to make metal ions released from said target; and applying a bias voltage to a piston ring body to be coated, to bring said metal ions, together with process gas particles, into adhesion to the surface of the piston ring body to form thereon a dense hard film.

DESCRIPTION OF THE PREFERRED EMBODIMENTS

Figure 1:
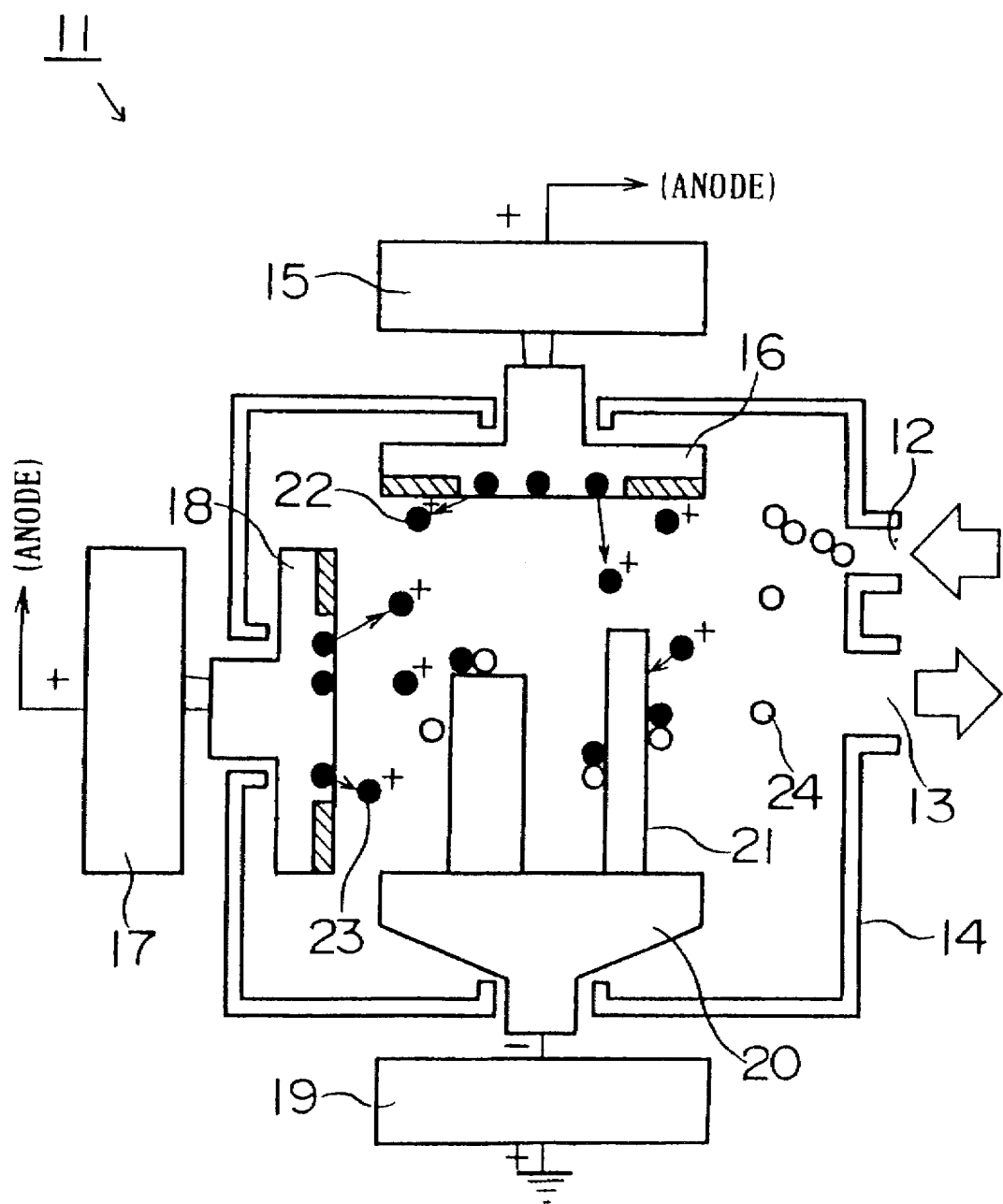
FIG. 1 illustrates an arc ion plating apparatus used in the manufacture of the piston ring of the present invention.

In the present invention, the metal not capable of forming a carbide or nitride may include cobalt, nickel and molybdenum, and one or more selected from these may preferably be employed. The metal capable of forming a carbide or nitride may include silicon, titanium, vanadium, chromium, iron, zirconium, niobium and tungsten, and one or more selected from these may preferably employed. In particular, titanium, chromium and vanadium are preferred.

In the manufacturing process of the present invention, the process gas may include, for example, acetylene and methane gas, which are preferably used when the carbide is formed, and nitrogen gas, which is preferably used when the nitride is formed.

In the present invention, there are no particular limitations on the thickness of the hard film. It may preferably be in the range of from 15 to 70 µm. A film with a thickness smaller than 15 µm makes it impossible to obtain satisfactory durability of the piston ring, and a film with a thickness larger than 70 µm tends to cause cracking or the like.

In the present invention, after the hard film has been formed, nitriding may be further applied to at least the sliding outer face of the body of the piston ring. As the nitriding, for example, salt bath soft nitriding, gas nitriding or the like may be employed.

Hard films formed by ion plating are commonly known to be composed of tungsten carbide, titanium nitride or chromium nitride as films having particularly good wear resistance. Because of a poor toughness, these films solely composed of any of these may be separated or cracked when worked or the piston ring is fitted to a piston. The films must each be controlled to have a thickness of 3 µm or less in the case of titanium carbide, 10 µm or less in the case of titanium nitride and 15 µm or less in the case of chromium nitride so that they can be used in the stressed state as in piston rings.

In the present invention, the metal not capable of forming a carbide or nitride and the metal capable of forming a carbide or nitride are used as targets, and the piston ring body serving as an article to be coated is subjected to what is called ion plating in a process gas atmosphere comprised of nitrogen or carbon as a component element, whereby the hard film comprising a fine mixed structure formed of a mixture of a carbide and a metal not capable of forming a carbide or a mixture of a nitride and a metal not capable of forming a nitride, is formed on at least the sliding outer face of the piston ring body.

This hard film contains a carbide or nitride in a very fine state and in an appropriate quantity, and hence can have a high hardness and superior wear resistance and seizure resistance. The hard film also contains the metal not capable of forming a carbide or nitride, and hence can achieve both adhesion to the piston ring body and film toughness. Thus, even when a hard film is formed in a large thickness, for example, in a thickness of from about 15 to 70 μm, the film does not tend to crack or chip, so that the hard film can be formed in a sufficiently large thickness to increase the durability of the piston ring.

In the present invention, the wear resistance and seizure resistance of the hard film can be controlled by changing the mixing ratio of the metal not capable of forming a carbide or nitride to the carbide or nitride of a metal capable of forming a carbide or nitride, depending on purpose.

The nitriding treatment after the hard film has been formed improves the contact with a ring groove of the piston, and can provide the piston ring with a much superior durability. The nitriding does not bring about damage of the hard film formed by ion plating. The nitriding may alternatively have been applied before the hard film is formed. This, however, may adversely affect the adhesion of the film formed by ion plating, since a compound layer and a porous layer which are formed by nitriding are brittle. Accordingly, in that instance, the ion plating may preferably be carried out after the compound layer and porous layer have been removed.

FIG. 1 illustrates an example of the arc ion plating apparatus used in the manufacture of the piston ring of the present invention.

This apparatus, denoted by reference numeral 11, is equipped with a vacuum tank having a process gas inlet 12 and an exhaust vent 13. This vacuum tank 14 is provided therein with a first target 16 connected to the cathode of an arc power source 15 and a second target 18 connected to the cathode of another arc power source 17. The first target 16 is comprised of one or more of the metal not capable of forming a carbide or nitride, selected from cobalt, nickel and molybdenum. The second target 18 is comprised of one or more of the metal capable of forming a carbide or nitride, selected from silicon, titanium, vanadium, chromium, iron, zirconium, niobium and tungsten. The vacuum tank 14 is further provided therein with a rotating table 20 connected to a bias power source 19. A piston ring body 21 serving as an article to be coated is placed on this rotating table 20. As the piston ring body 21, those made of cast iron or steel are preferably be used. An alloy of the metals for the targets 16 and 18 may be used so that the targets can be put into one set.

A process of forming a hard film on the piston ring body 21 using this arc ion plating apparatus 11 will be described below.

After the first target 16, second target 18 and piston ring body 21 have been disposed as described above, the inside of vacuum tank 14 is evacuated through the exhaust vent 13 to bring the inside to a vacuum of $1.3 \times 10^{-3}$ Torr or less. Then, the targets 16 and 18 and trigger switches (not shown) are connected or disconnected to generate vacuum arc discharge (arc current: 100 A) so that the piston ring body 21 is cleaned and heated by ion bombardment caused by accelerated ions. At this stage, a bias voltage of 700 V is applied.

Thereafter, a process gas such as nitrogen or acetylene is fed, and a bias voltage of 50 V is applied to the piston ring body 21 to regenerate arc discharge (arc current: 100A). At this stage, the arcs form spots on the surfaces of the targets 16 and 18, where the metals of targets 16 and 18 are melted and evaporated by the action of the energies of the arc currents and fly out in the form of metal ions 22 and 23. Then the metal ions 22 and 23, together with particles 24 of the process gas such as nitrogen or acetylene, come into adhesion to the surface of the piston ring body 21 to form a dense film thereon.

In this case, the metal of the first target 16 does not react with nitrogen or carbon or, if reacts, is readily separated, and hence is deposited as the metal itself. As for the metal of the second target 18, it reacts with nitrogen or carbon of the process gas and is deposited as a nitride or carbide. As a result, the film formed on the surface of the piston ring body 21 becomes a mixed structure comprised of the metal of the first target 16 and the nitride or carbide of the metal of the second target 18.

Experiment 1

In The manner described above, a hard film comprising a mixed structure comprised of a metal selected from Co. Ni and Mo and a nitride or carbide selected from titanium nitride, chromium nitride, vanadium nitride and tungsten carbide was formed on a piston ring body comprising a body material made of 17 chrome stainless steel. After the hard film was formed, the body material was subjected to nitriding. Piston rings were obtained in this way and the thickness and hardness of the hard film of each of them were measured to obtain the results shown in Table 1.

For comparison, a piston ring whose body comprising a body material made of SWOSC (JIS G3566; oil tempered chromium silicon alloy steel wires) was coated with Cr, a piston ring whose body comprising a body material made of 17 chrome stainless steel was subjected to gas nitriding, a piston ring whose body comprising a body material made of 17 chrome stainless steel was provided thereon with a titanium nitride film formed by PVD and whose body material was further subjected to nitriding, and a piston ring whose body comprising a body material made of 17 chrome stainless steel was provided thereon with a chromium nitride film formed by PVD and whose body material was further subjected to nitriding, were produced. The film thickness and hardness of each of them are also shown in Table 1.

TABLE 1

| Body material | Surface treatment | Coating thickness (μm) | Hardness (Hv) |
|---|---|---|---|
| Comparative Example: | | | |
| SWOSC | Cr plating | 150 | 900 |
| 17 CrSUS | Gas nitriding | 70 | 1,150 |
| 17 CrSUS Nitrided | titanium nitride-PVD | 2, 5, 10 | 2,600 |
| 17 CrSUS Nitrided | Chromium nitride-PVD | 10, 20, 30, 50 | 1,800 |

TABLE 1-continued

| Body material | Surface treatment | Coating thickness (μm) | Hardness (Hv) |
|---|---|---|---|
| Present Invention: | | | |
| 17 CrSUS Nitrided | cobalt + titanium nitride | 30, 70 | 1,300 |
| 17 CrSUS Nitrided | cobalt + chromium nitride | 30, 70 | 1,250 |
| 17 CrSUS Nitrided | cobalt + vanadium carbide | 30, 70 | 1,300 |
| 17 CrSUS Nitrided | cobalt tungsten carbide | 30, 70 | 1,500 |
| 17 CrSUS Nitrided | nickel + titanium nitride | 30, 70 | 1,300 |
| 17 CrSUS Nitrided | nickel + chromium nitride | 30, 70 | 1,250 |
| 17 CrSUS Nitrided | nickel + vanadium carbide | 30, 70 | 1,300 |
| 17 CrSUS Nitrided | nickel + tungsten carbide | 30, 70 | 1,500 |
| 17 CrSUS Nitrided | molybdenum + titanium nitride | 30, 70 | 1,350 |
| 17 CrSUS Nitrided | molybdenum + chromium nitride | 30, 70 | 1,280 |
| 17 CrSUS Nitrided | molybdenum + vanadium carbide | 30, 70 | 1,420 |
| 17 CrSUS Nitrided | molybdenum + tungsten carbide | 30, 70 | 1,600 |

Example 2

Ring materials prepared using the same body materials as in Example 1 and subjected to surface treatment under the same conditions were used as upper test pieces, and opposing materials-made of a cast iron material FC25 (JIS G 5501; gray iron casting) were used as lower test pieces. On these test pieces, wear tests were made using a reciprocating wear test machine. In each test, running-in was first carried out under conditions of 2 kgf×100 cpm×5 min and then run proper was carried out under conditions of 10 kgf×600 cpm×5 hr, where the depth of wear (μm) of the ring material (upper test piece) and that of the opposing material (lower test piece) were measured.

Figure 2:
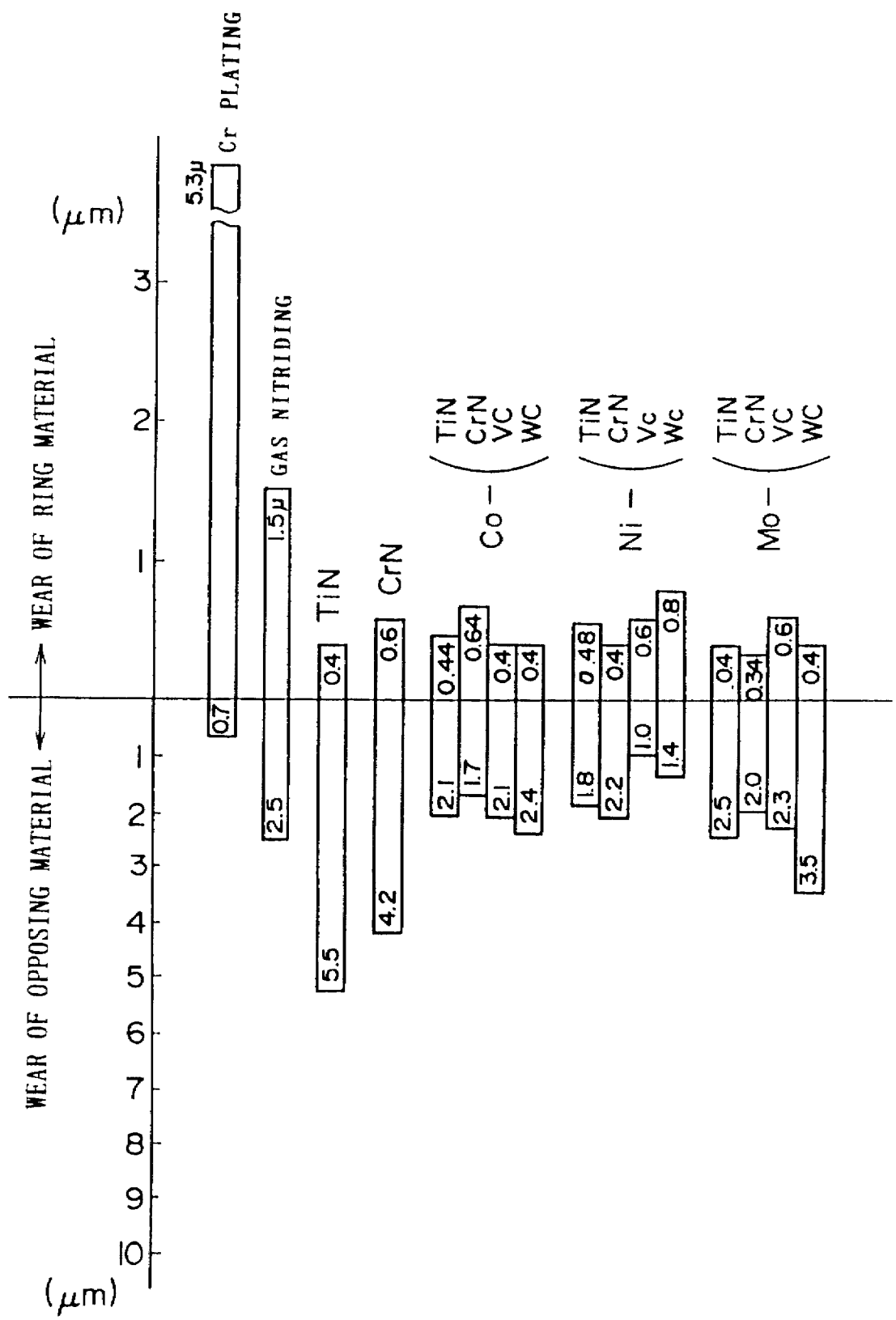
FIG. 2 shows results of wear tests carried out using a reciprocating wear test machine, by bringing various surface-treated ring materials of Examples and Comparative Examples into reciprocating friction with opposing materials.

Results obtained are shown in FIG. 2. As is seen therefrom, the ring materials of the present invention, having the hard film comprising a fine mixed structure formed of any one selected from Co, Ni and Mo and any one selected from titanium nitride, chromium nitride, vanadium carbide and WC, have a smaller depth of wear in both the wear of ring material themselves and the wear of opposing materials, than those of comparative examples respectively provided with a Cr film, a nitrided layer, a titanium nitride film and a chromium nitride film.

Example 3

Figure 3A:
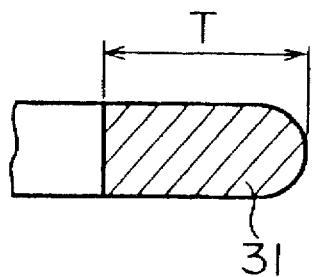
FIGS. 3A and 3B illustrate a peel test method carried out on the hard film formed on a piston ring.
Figure 3B:
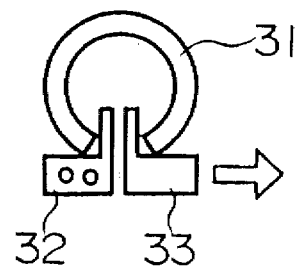

In respect of the piston rings obtained in Experiment 1, peel tests were made on the hard films by the method as shown in FIG. 3. More specifically, as shown in FIG. 3B, a stationary hook 32 and a movable hook 33 were engaged to the gap of a piston ring 31, and the movable hook 33 was moved in the direction of an arrow shown in the drawing, to measure how many times (nT) the width T shown in FIG. 3A, of a cross section of the piston ring 31 was expanded before the separation of the hard film occurred.

Figure 4:
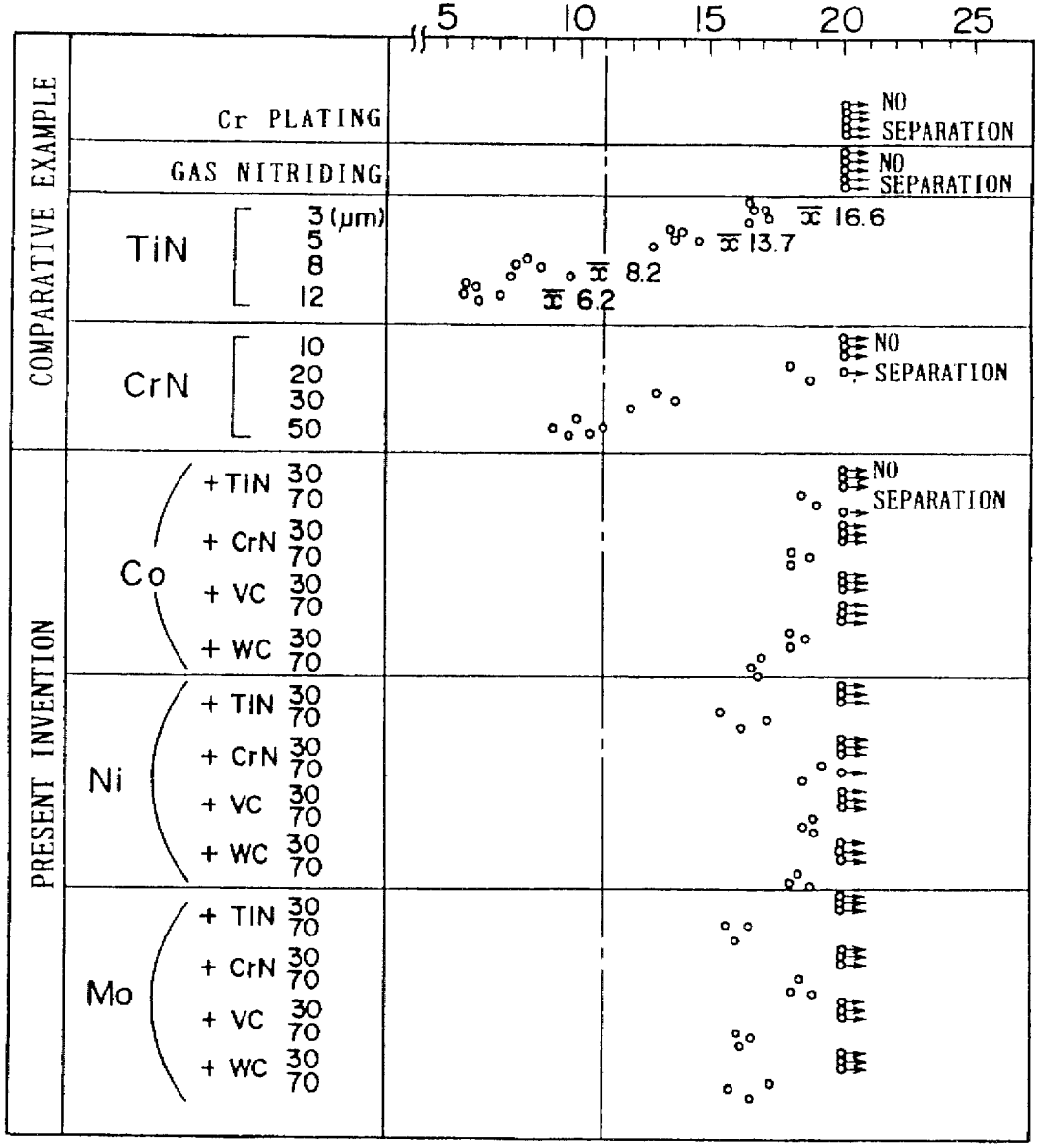
FIG. 4 shows results of peel tests carried out on various surface-treated piston rings of Examples and Comparative Examples.

Results obtained are shown in FIG. 4. In FIG. 4, Comparative Examples consist of rings respectively provided with a Cr coating, a nitrided layer, and a titanium nitride or CrN film formed by PVD. With regard to the titanium nitride film, four kinds of films of 3, 5, 8 and 12 μm thick were prepared, and, with regard to the chromium nitride film, four kinds of films of 10, 20, 30 and 50 μm thick. Examples of the present invention consist of rings having the hard film comprising a fine mixed structure formed of any one selected from Co, Ni and Mo and any one selected from titanium nitride, chromium nitride, vanadium carbide and tungsten carbide, and two kinds of films of 30 and 70 μm thick were prepared for each combination. In FIG. 4, the upper abscissa indicates a scale marked in the expanded width nT. In its lower columns, the position at which the film separation occurred in each ring is indicated by a small circle. The measurement was made on five samples in respect of the rings respectively provided with a Cr coating and two samples in respect of other rings.

As is seen from the results shown in FIG. 4, the rings provided with a Cr coating and a nitrided layer have caused no film separation, whereas those provided with a titanium nitride or chromium nitride film formed by PVD tend to cause film separation with an increase in the coating thickness. On the other hand, those provided with the hard film comprising a fine mixed structure formed of any one selected from Co, Ni and Mo and any one selected from titanium nitride, chromium nitride, vanadium carbide and tungsten carbide have caused film separation at the positions falling under the range in which there is no difficulty in practical use (nT>11), regardless of those of 30 μm thick or those of 70 μm thick.

As described above, according to the present invention, the piston ring is provided on at least its sliding outer face, with the hard film comprising a fine mixed structure formed of a mixture of a carbide and a metal not capable of forming a carbide or a mixture of a nitride and a metal not capable of forming a nitride. Hence the adhesion to piston ring body and the film toughness can be improved, and cracking or separation can be prevented from occurring, even when the film is formed in a large thickness. The presence of a carbide or a nitride in the hard film contributes to the achievement of superior wear resistance, and its fine structure enables a decrease in the wear of the opposing material. Moreover, because of the fine structure of the hard film, no film lubrication tends to be lost and the seizure resistance can be excellent. Furthermore, the nitriding carried out on the piston ring having been provided with the hard film improves the contact with the piston ring groove and can provide the piston ring with a superior durability.

What is claimed is:

1. A process for manufacturing a piston ring, comprising:

(a) causing an arc discharge in a process gas atmosphere comprised of nitrogen or carbon as a component element, using as a cathode a target comprised of (i) a metal selected from the group consisting of cobalt and nickel and (ii) a metal selected from the group consisting of silicon, titanium, vanadium, chromium, iron, zirconium, niobium and tungsten, wherein the cobalt or nickel is applied to the piston ring without forming a carbide or nitride and wherein the metal selected from the group consisting of silicon, titanium, vanadium, chromium, iron, zirconium, niobium and tungsten is applied to the piston ring as a nitride or a carbide, to release metal ions from said target; and (b) applying a bias voltage to a piston ring body to bring said metal ions together with particles of the process gas, into adhesion to a surface of the piston ring body to form a film coating thereon.

2. The process according to claim 1, wherein said process gas is selected from the group consisting of nitrogen, acetylene and methane.

3. The process according to claim 1, wherein, after said film has been formed, nitriding is carried out.

4. The process according to claim 2, wherein said bias voltage is 50 volts.

5. The process according to claim 2, wherein the film has a thickness of 15 to 70 μm.

6. The process according to claim 5, wherein the piston ring body is made of cast iron.

7. The process according to claim 5, wherein the piston ring body is made of steel.

8. The process according to claim 2, wherein the arc discharge is carried out in a vacuum of $1.3 \times 10^{-3}$ Torr or less.

* * * * *